(12) United States Patent
Figus

(10) Patent No.: US 9,625,182 B2
(45) Date of Patent: Apr. 18, 2017

(54) COOLING DEVICE

(71) Applicant: ASTRIUM SAS, Suresnes (FR)

(72) Inventor: Christophe Figus, Dremil Lafarge (FR)

(73) Assignee: AAIRBUS DEFENCE AND SPACE SAS, Les Mureaux (FR)

( * ) Notice: Subject to any disclaimer, the term of this patent is extended or adjusted under 35 U.S.C. 154(b) by 0 days.

(21) Appl. No.: 14/365,629

(22) PCT Filed: Dec. 13, 2012

(86) PCT No.: PCT/EP2012/075430
§ 371 (c)(1),
(2) Date: Jun. 14, 2014

(87) PCT Pub. No.: WO2013/092386
PCT Pub. Date: Jun. 27, 2013

(65) Prior Publication Data
US 2014/0362530 A1  Dec. 11, 2014

(30) Foreign Application Priority Data
Dec. 20, 2011 (FR) ...................... 11 03954

(51) Int. Cl.
F25B 6/02 (2006.01)
F28D 15/04 (2006.01)
H05K 7/20 (2006.01)

(52) U.S. Cl.
CPC .............. *F25B 6/02* (2013.01); *F28D 15/043* (2013.01); *H05K 7/20309* (2013.01); *H05K 7/20318* (2013.01); *H05K 7/20327* (2013.01); *H05K 7/20* (2013.01)

(58) Field of Classification Search
CPC .... F25B 6/02; H05K 7/20318; H05K 7/2039; F24H 8/006
USPC ................... 361/679.53, 700; 165/80.4–80.5
See application file for complete search history.

(56) References Cited

U.S. PATENT DOCUMENTS

| | | | |
|---|---|---|---|
| 6,360,813 B1* | 3/2002 | Katoh ................ | H05K 7/20672 165/104.33 |
| 6,606,867 B1* | 8/2003 | Sienel ..................... | F25B 9/008 62/113 |
| 7,143,816 B1* | 12/2006 | Ghosh .................. | H01L 23/473 165/104.28 |

(Continued)

FOREIGN PATENT DOCUMENTS

FR 2669719 A1 5/1992
WO 2011/007604 A1 1/2011

*Primary Examiner* — David M Sinclair
*Assistant Examiner* — Robert Brown
(74) *Attorney, Agent, or Firm* — Im IP Law; C. Andrew Im

(57) ABSTRACT

A device for cooling at least two distinct heat sources comprises a closed circuit in which a diphasic fluid flows. At least one capillary evaporator is configured to be placed in thermo contact with one of the heat sources, referred to as the primary heat source. Each other heat source referred to as a secondary heat source that is to be cooled. At least one exchanger configured to be placed in thermal contact with the secondary heat source. At least one first condenser positioned downstream of the evaporator, and upstream of the at least one exchanger. At least one last condenser positioned upstream of the evaporator and downstream of the at least one exchanger.

28 Claims, 4 Drawing Sheets

(56) References Cited

U.S. PATENT DOCUMENTS

| | | | |
|---|---|---|---|
| 7,261,144 B2* | 8/2007 | Thome | F28D 15/0266 165/104.21 |
| 2001/0042380 A1* | 11/2001 | Cho | F25B 41/00 62/238.2 |
| 2002/0066277 A1* | 6/2002 | Tsenter | F04B 35/00 62/46.2 |
| 2006/0016214 A1* | 1/2006 | Gorbounov | F25B 13/00 62/513 |
| 2006/0162903 A1* | 7/2006 | Bhatti | F28D 15/0266 165/104.14 |
| 2007/0095087 A1* | 5/2007 | Wilson | F25B 40/00 62/259.2 |
| 2008/0087406 A1* | 4/2008 | Asfia | F28D 15/0233 165/104.29 |
| 2009/0101308 A1* | 4/2009 | Hardesty | F28D 1/035 165/80.4 |
| 2009/0219681 A1* | 9/2009 | Goth | F25B 49/02 361/679.53 |
| 2009/0288801 A1* | 11/2009 | Figus | B64G 1/506 165/47 |
| 2010/0199712 A1* | 8/2010 | Lifson | F25B 41/04 62/498 |
| 2010/0263836 A1* | 10/2010 | Figus | F28D 15/043 165/104.26 |
| 2011/0056225 A1* | 3/2011 | Campbell | F28D 15/0266 62/208 |
| 2011/0192575 A1* | 8/2011 | Figus | F28D 15/043 165/104.26 |
| 2012/0132402 A1* | 5/2012 | Aoki | F28D 15/0266 165/104.21 |
| 2012/0266612 A1* | 10/2012 | Rodriguez | H02K 9/12 62/62 |
| 2012/0279682 A1* | 11/2012 | Bonnet | F28D 15/043 165/62 |
| 2012/0324911 A1* | 12/2012 | Shedd | F25B 25/00 62/62 |
| 2013/0186602 A1* | 7/2013 | Figus | F28D 15/0266 165/104.26 |

* cited by examiner

COOLING DEVICE

RELATED APPLICATIONS

This application is a §371 application from PCT/EP2012/075430 filed Dec. 13, 2012, which claims priority from French Patent Application No. 11 03954 filed Dec. 20, 2011, each of which is herein incorporated by reference in its entirety.

TECHNICAL FIELD OF THE INVENTION

The present invention relates to the field of heat exchangers. It relates more particularly to a type of purely passive thermal regulation device based on a heat transfer loop with a flow of fluid that is used to cool a plurality of heat sources.

BACKGROUND OF THE INVENTION

Figure 1:
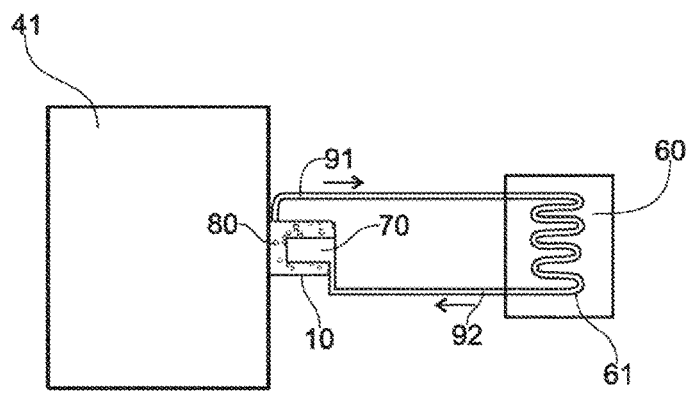

According to the prior art shown in FIG. 1, a heat transfer fluid loop, used to cool a heat source 41, comprises:
1) a closed conduit in which a diphasic fluid flows,
2) a heat exchanger 10, known as an evaporator, that carries out heat exchange between the fluid and the heat source, and
3) a heat exchanger 61, known as a condenser, that carries out heat exchange between the fluid and a heat sink 60 for cooling.

The diphasic fluid used is generally in the mainly liquid state in the cold part of the loop, and in the mainly gaseous state in the hot part thereof.

A typical heat source is formed for example by an item of dissipative electronic equipment, and a typical heat sink is formed for example by a radiator in contact with an environment that is colder than the heat source or else by a thermodynamic cycle machine, for example a Stirling cycle machine, that produces cold from electrical energy.

More generally, a heat source may be formed by an element that is not necessarily electronic and is heated by items of dissipative electronic equipment or by elements outside the system. This is the case for example when a set of items of electronic equipment is fastened to a support structure, optionally by distributing the heat emitted by the items of equipment to the structure as a whole by means of heat pipes or any other device for this purpose. In this case, the heat source to be considered is the assembly formed by the support structure and the items of equipment, and the heat exchanger of the heat transfer fluid loop may be positioned either on a particular item of equipment or on the support structure. It is also possible to bear in mind that simple structural elements that are illuminated by the sun (such as baffles for example) may form heat sources.

In the more particular field of fluid loops in which the fluid is pumped by capillarity (known as a "capillary fluid loop"), the evaporator 10 may advantageously comprise a reserve 70 (see FIGS. 1 and 7) of fluid in the diphasic liquid/vapor state (in the case of a fluid loop known as a "loop heat pipe") and in all cases a porous mass 80, or advantageously a microporous mass (pores having a micrometric size), for pumping the liquid by capillarity.

The reserve of liquid, known as a reservoir 70, is located close to the microporous mass in order to provide it with liquid. The liquid present in the reservoir is pumped through the microporous mass, which is positioned as close as possible to the heat source. The liquid vaporizes mainly in this region, and the vapor 91 thus created is evacuated through a conduit toward the heat sink, wherein it condenses in the region of the condenser and then returns toward the evaporator in a partially or completely liquid form 92 through another conduit in order to create a heat transfer cycle.

For its part, the condenser may be formed simply by the conduit that conveys the fluid, generally a simple tube, to which a device (for example a soleplate) for reinforcing heat exchange between the conduit and the heat sink is added.

When a plurality of separate and spaced-apart heat sources are intended to be cooled, the prior art (for example US2011/0056225) suggests the use of as many fluid loops as the heat sources, or suggests multiplying the capillary evaporators on parallel circuits. A fluid loop evaporator is positioned in contact with each heat source and is connected to a radiator in order to evacuate the heat from the heat source. There are thus as many evaporators and fluid loops as there are heat sources.

BRIEF SUMMARY OF THE INVENTION

The invention primarily relates to a cooling device for cooling at least two heat sources, characterized in that it comprises:
- a closed circuit in which a diphasic fluid flows,
- at least one evaporator, positioned in thermal contact with one of the heat sources, known as the primary heat source,
- for each other heat source, known as a secondary heat source, to be cooled, at least one heat exchanger designed to be positioned in thermal contact with said secondary heat source,
- at least one condenser, known as the first condenser, positioned downstream (in the theoretical direction of travel of the fluid in the circuit) of the evaporator, and upstream of the at least one heat exchanger,
- at least one condenser, known as the last condenser, positioned upstream (in the theoretical direction of travel of the fluid in the circuit) of the evaporator and downstream of the at least one heat exchanger.

In one particular application, for example for the field of vehicles in microgravity, the evaporator is advantageously an evaporator of the capillary type. It will be understood that the use of a capillary evaporator makes it possible to create a passive cooling device.

It will be understood that the invention makes it possible to use only one fluid loop and one evaporator to cool at least two separate and optionally spaced-apart heat sources. The distance between the two heat sources may vary from a few millimeters, or centimeters, to several meters, depending on the application.

The device furthermore makes it possible to improve the capacity of the fluid loop to operate through a thermal environment that is hotter than the operating temperature of the fluid loop.

According to one particular embodiment, the device furthermore comprises at least one condenser, known as the secondary condenser, positioned between two secondary heat sources.

In one more particular embodiment, the device comprises, for each heat exchanger, condensers positioned directly upstream and downstream of said heat exchanger, the condensers being designed to be positioned in thermal contact with heat sinks. The term "directly" is understood to mean that each condenser is separated from the associated heat exchanger only by a conduit in which the fluid flows, and not by another heat exchanger.

It will be understood that the diphasic fluid then flows from the evaporator alternately through the condensers and through the heat exchangers, a condenser being positioned upstream and downstream of each heat exchanger.

According to various embodiments of the device, which are optionally used in combination:
- at least one heat exchanger is formed by a tube of small diameter (from a few tenths of a millimeter to several millimeters),
- the closed circuit is produced in the form of a tube, said tube having a capillary internal structure at least in the region of one heat exchanger,
- the last condenser is integrated in the reservoir of the capillary evaporator.

The invention secondly relates to a thermal loop comprising at least two heat sources and at least one heat sink, and a cooling device as described.

Advantageously, the evaporator is positioned on the most dissipative heat source, namely the primary heat source.

Advantageously, the primary heat source has a thermal power greater than or equal to the sum of the thermal powers of the secondary heat sources that are positioned between any pair of successive condensers.

According to one particular embodiment, the thermal loop also comprises a heater, designed to be positioned in the region of the primary heat source in order to create a thermal power which is added to the thermal power of the primary heat source such that the sum of the powers dissipated by said primary heat source and said heater is greater than or equal to the sum of the thermal powers of the secondary heat sources that are located between any pair of successive condensers.

According to one embodiment which makes it possible to simplify the production of the thermal loop, at least two condensers are positioned on the same heat sink.

According to one particular embodiment, the head loss between the capillary evaporator, or a heat exchanger, on one side, and a condenser located downstream of said capillary evaporator, or of said heat exchanger, on the other side, is designed to lower the vaporization temperature in the heat exchangers positioned downstream of said condenser below a given value.

In this case, according to one embodiment, the head loss is brought about by a device that lowers the pressure in a fluid conduit located between said capillary evaporator, or said heat exchanger, on one side, and said condenser on the other side.

In another embodiment, which is optionally used in combination therewith, the head loss is brought about by adapting the length and/or the diameter of a fluid conduit located between said evaporator, or said heat exchanger, on one side, and said condenser on the other side.

According to further aspects, the invention relates to an instrument having a cooling device or a thermal loop as described.

The invention also relates to an electronic board having a cooling device or a thermal loop as described. Advantageously, the heat sink is formed by the soleplate of the electronic board.

According to yet another aspect, the invention relates to an equipment panel, characterized in that it comprises a cooling device or a thermal loop as described.

According to one embodiment, the panel comprises a first face on which items of equipment are fastened, and the opposite face from this first face is a heat sink.

In one embodiment, the device comprises an evaporator and a conduit of which the different parts are successively condensers and heat exchangers, the parts of the conduit that are connected to the evaporator being condensers.

Preferably, the fluid flows between the capillary evaporator and the first condenser in the form of vapor.

According to one preferred embodiment, the first condenser is closer to the first heat exchanger downstream of said evaporator than to said evaporator, in order to limit thermal leaks to the environment over liquid or diphasic (liquid/vapor) sections of tube.

Similarly, according to one preferred embodiment, the last condenser is closer to the evaporator than to the last heat exchanger downstream of the evaporator.

Advantageously, the diphasic fluid flowing in the closed loop has a low saturation gradient (dP/dT, where P is the pressure and T the temperature), thereby allowing vaporization in the heat exchanger at a saturation temperature that is lower than the saturation temperature of the evaporator by several degrees (order of magnitude 10 K).

The invention secondly relates to a satellite having at least one device or a thermal loop as described.

PRESENTATION OF THE FIGURES

The features and advantages of the invention will be better appreciated from the following description, which sets out the features of the invention by way of a nonlimiting application example.

Figure 2:
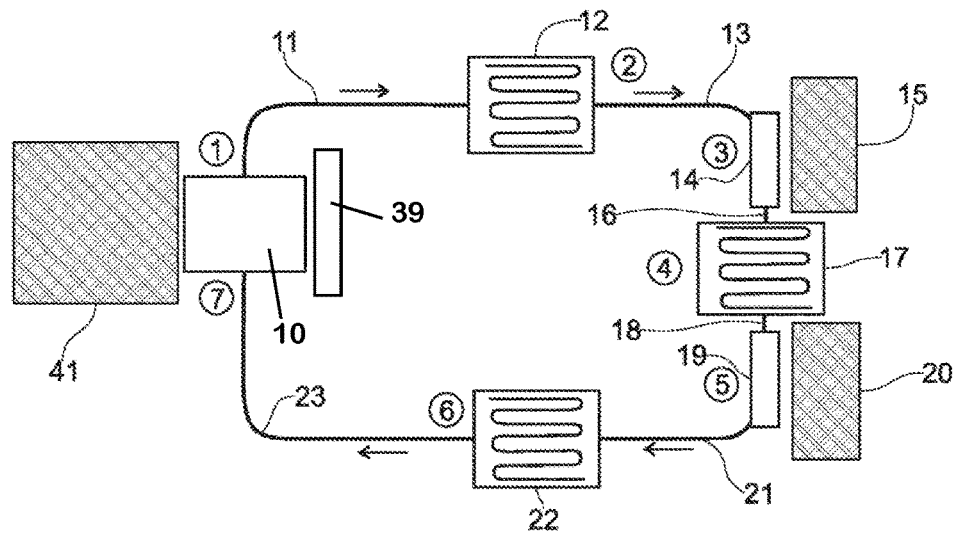
Figure 3:
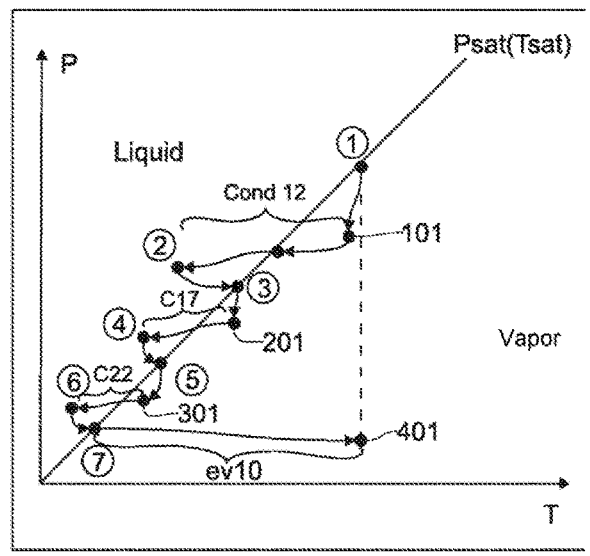
Figure 4:
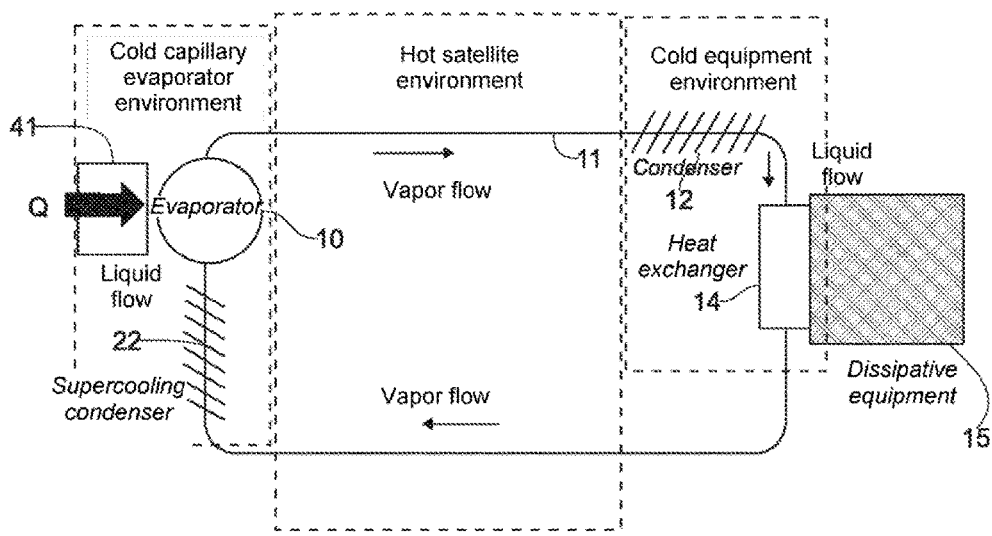
Figure 5:
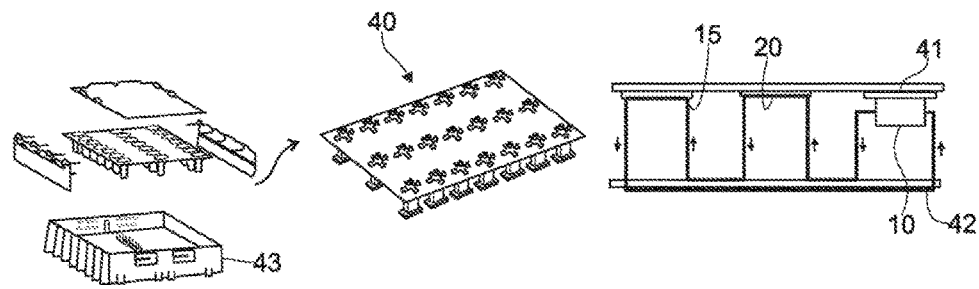
Figure 6:
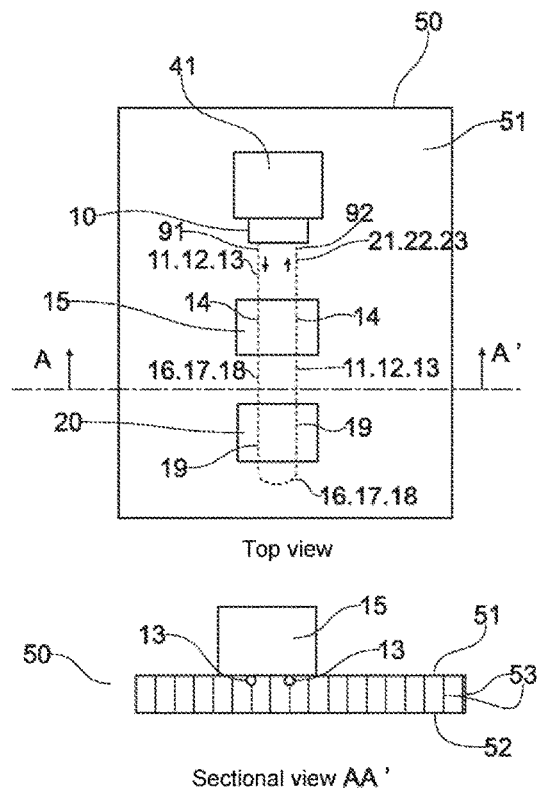
Figure 7:
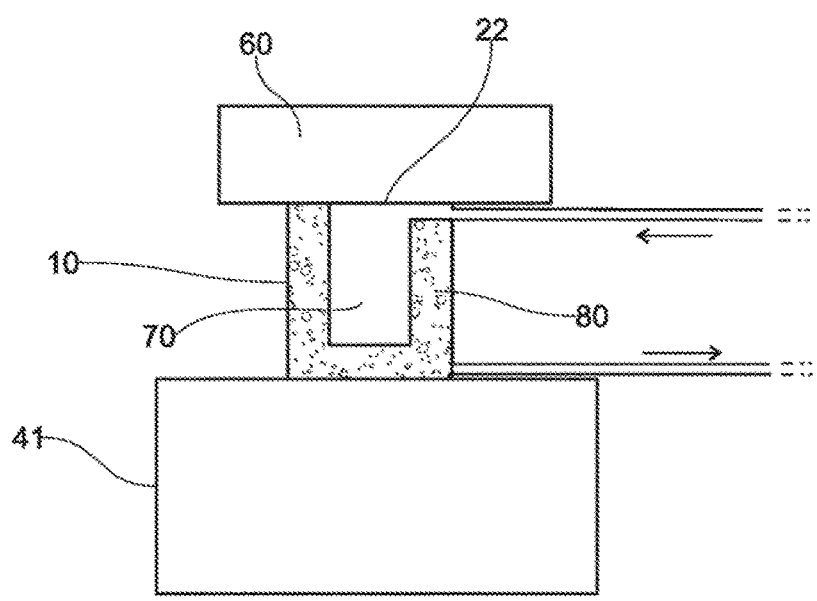

The description is based on the appended figures, in which:

FIG. 1 (already cited) shows an example of a capillary fluid loop having a flat evaporator in an assembly known from the prior art, FIG. 2 shows an example of a device according to the invention, having an evaporator, a plurality of heat exchangers and condensers, FIG. 3 shows a representative pressure/temperature diagram of the fluid circuit illustrated in FIG. 2, FIG. 4 shows an implementation example of the device in an application for an optical instrument, FIG. 5 shows an implementation example of the device in an application for cooling of an electronic board, FIG. 6 shows an implementation example of the device in an application for cooling of a plurality of items of electronic equipment that are positioned on a radiating panel, FIG. 7 shows an example in which a condenser is integrated in the evaporator.

DETAILED DESCRIPTION OF AN EMBODIMENT OF THE INVENTION

In the present embodiment, given here by way of illustrative and nonlimiting example, a device according to the invention is used in the context of a cooling loop on board a vehicle in a weightless state, in this case a terrestrial satellite. This cooling loop is designed and sized in accordance with the items of equipment on board the satellite. Thus, its geometry depends on the geometry of the on-board items of equipment, and the disposition thereof within said satellite.

In the present exemplary embodiment, a cooling device is a sealed enclosure in which a diphasic fluid flows, this enclosure comprising, as illustrated in FIG. 2, a capillary evaporator 10, at least one other heat exchanger 14, 19 (two are shown here), at least two condensers 12, 22 upstream and downstream of the evaporator 10, in this case another condenser 17 downstream of the heat exchanger 14 and upstream of the heat exchanger 19, and conduits 11, 13, 16, 18, 21 and 23 connecting these various elements.

Upstream and downstream are defined in accordance with the theoretical direction of travel of the fluid in the circuit.

A heat exchanger is in this case by definition a part of the device where the diphasic fluid is in thermal contact with a heat source. In this sense, an evaporator is a heat exchanger.

A condenser is in this case by definition a part of the device where the diphasic fluid is in thermal contact with a heat sink.

A capillary evaporator is in this case by definition a heat exchanger in which the evaporation of the fluid takes place within a (micro)porous mass 80.

The capillary evaporator 10 is designed to be positioned such as to be in a heat exchange relationship, and preferably in contact with a heat source, known as the primary heat source 41. In the embodiment described here, this primary heat source 41 is chosen as the heat source that dissipates the most thermal power, from a predetermined set of heat sources to be cooled.

This evaporator 10 is of the type known per se. It is a capillary evaporator, for example a flat evaporator as illustrated in FIG. 2, or a cylindrical evaporator in accordance with the prior art, designed to be positioned in contact with the primary heat source 41 by way of one of its faces or by way of a soleplate provided to this end.

It will be recalled that in a capillary evaporator, a liquid is kept within a microporous mass 18, in spite of the absence of gravity, by surface tension forces that exist within the cells of the microporous mass, the latter being supplied with liquid by a fluid reservoir 70 positioned in the immediate vicinity.

Since the microporous mass is positioned as close as possible to the primary heat source 41, the liquid vaporizes in this region. The resulting flow rate of fluid is approximately proportional to the thermal power of the primary heat source 41.

The vapor thus created in the region of the evaporator 10 is conveyed through a first conduit 11, of a type and material that are known per se, toward a first condenser 12, shown very schematically in FIG. 2, which is designed to be positioned in thermal contact with a first heat sink (not illustrated in FIG. 2).

This first condenser 12 may be, for example, a tube of small diameter (typically a few millimeters) meandering in a serpentine manner at the surface of a flat radiator that radiates into free space, this radiator acting as a heat sink. In the region of this first condenser 12, the vapor is completely or partially converted into a flow of liquid by virtue of the heat exchanges taking place between the fluid in the vapor phase and said heat sink.

In an optimal embodiment, the heat sink (not shown in FIG. 2) and the condenser 12 are sized (for example in terms of temperature of the heat sink and of length of the tube in the region of the condenser 12) such that the flow rate of liquid leaving the condenser 12 is sufficient for it to vaporize in the heat exchanger 14, making it possible to transfer a large part of the heat dissipated by the heat source 15 to the fluid.

After this passage through the first condenser 12, the liquid (or the diphasic liquid/vapor mixture) leaving the first condenser 12 is driven by the flow of the vapor (provided that the forward pressure of the evaporator 10 is greater than the head losses in the device) and flows through a second conduit 13 as far as a second heat exchanger 14 (the first heat exchanger in contact with a heat source being the evaporator 10), which is positioned in the immediate vicinity, and is preferably in contact with a second heat source 15, known as the first secondary heat source, that advantageously dissipates a thermal power less than the primary heat source 41.

The second heat exchanger 14 makes it possible to transfer the thermal power of the secondary heat source 15 to the fluid of the device, essentially by vaporization of the liquid. This second heat exchanger 14, which is shown very schematically in FIG. 2, may be formed advantageously by a conduit having a capillary internal structure at its periphery (grooved profile or microporous mass) positioned such that the liquid of the diphasic fluid is distributed by capillarity to the area of the conduit where the heat exchange takes place, or more simply by a small-size conduit in direct contact with the secondary heat source 15, it being possible for this conduit to be a cylindrical tube that may be extended by a flat soleplate that promotes heat exchange, or a conduit in the form of a plate advantageously designed to maximize the area for exchange of heat.

In contact with the heat emitted by the secondary heat source 15, the liquid is heated and completely or partially vaporizes, thereby absorbing a greater or lesser quantity of energy.

The diphasic fluid emerging from the second heat exchanger 14 is driven by the forced flow created by the capillary evaporator 10 through a third conduit 16 as far as a second heat sink, optionally coincident with the first heat sink, where an intermediate condenser 17 cools the diphasic fluid heated by the secondary heat source.

In the device illustrated in FIG. 2, after this passage through the intermediate condenser 17, the liquid (or the diphasic liquid/vapor mixture) leaving the intermediate condenser 17 is driven by the flow of the vapor and flows through a fourth conduit 18 as far as a third heat exchanger 19, which is positioned in the immediate vicinity and is preferably in contact with a third heat source 20, known as the second secondary heat source, that advantageously dissipates a thermal power less than the primary heat source 41.

The third heat exchanger 19 makes it possible to transfer the thermal power of the third heat source 20, known as the second secondary heat source, to the fluid of the device. This third heat exchanger 19 may be of the same type as the second heat exchanger 14.

The diphasic fluid emerging from the third heat exchanger 19 is driven by the forced flow created by the capillary evaporator 10 through a fifth conduit 21 as far as a third heat sink, optionally coincident with the preceding heat sinks, where a last condenser 22 cools the diphasic fluid heated by the secondary heat source 20.

A sixth conduit 23 returns the fluid cooled by the last condenser 22 to the capillary evaporator 10. This last condenser 22 is advantageously located in the vicinity of the capillary evaporator 10 so as to limit the heating of the liquid arriving in the capillary evaporator 10 by the more or less hot environment in which the conduit 23 is located.

FIG. 2 is given only by way of illustration of one embodiment of the device according to the invention.

Another, more simple embodiment may have no intermediate condenser 17. This may advantageously be the case when the sum of the thermal powers of the secondary heat sources 15, 20 is less than the thermal power of the primary heat source 41.

Another, even more simple embodiment would only comprise a single secondary heat source 14 and no intermediate condenser 17.

By contrast, in order to cover all of the possible embodiments, a person skilled in the art will understand that it is possible to multiply the number of secondary heat sources and condensers as long as the head losses in the fluid loop are less than the maximum capillary pressure of the capillary evaporator.

In the most general case, the device may have K condensers C1, . . . , CK (K>=2), the condensers C1 and CK necessarily having to be positioned respectively downstream and upstream of the evaporator, and, between two successive condensers Ci and Ci+1, it may have Ni heat exchangers Ei,1, Ei,2, . . . , Ei,Ni in thermal contact with Ni secondary hot sources. If the evaporator of the capillary fluid loop that is positioned on the primary heat source 41 is denoted E00, the flow of fluid follows the following path (where the symbol ">" naturally indicates the direction of flow of the fluid):

E00>C1>E1,1>E1,2> . . . >E1,N1>C2>E2,1>E2,2> . . . E2,N2>C3> . . . >CK−1>EK−1, 1>EK−1,2> . . . > EK−1, NK>CK>E00.

In this general case, it will be advantageous for the thermal power of the primary heat source to be greater than or equal to the sum of the thermal powers of the secondary heat sources in contact with the heat exchangers Ei,1, Ei2, . . . Ei,Ni that are positioned between the pair of condensers Ci, Ci+1, whichever pair of condensers this is.

The successive states of the diphasic fluid within the fluid loop of the device described are illustrated in FIG. 3, which shows the pressure/temperature diagram of the fluid as it travels through a cooling device as illustrated in FIG. 2 and described above. This FIG. 3 shows the curve Psat (Tsat) showing the saturation pressure Psat as a function of the saturation temperature Tsat, that is to say the limit between the liquid domain and the gaseous domain of the fluid flowing in the capillary fluid loop (outside the microporous mass).

As can be seen in this figure, for which points 1 to 7 correspond to the points indicated in FIG. 2, the fluid leaving the evaporator 10 (point 1 in FIGS. 2 and 3) shows a pressure/temperature pair located on the liquid/vapor transition curve. It is here that the point having the greatest pressure P(1) and the highest temperature T(1) is located. Throughout the thermal loop, the pressure of the fluid will decrease as it flows, on account of the head losses in the conduits, condensers and heat exchangers.

As it flows through the first conduit 11, the vapor loses a part of its pressure and enters the first condenser 12 at a point denoted 101 in FIG. 3.

In this first condenser 12, the vapor is condensed. The outlet point from the first condenser (point 2 in FIG. 3) is in this case in the liquid domain of the diagram, if it is assumed that all of the vapor has been condensed in the condenser and if the liquid has been cooled below the saturation pressure at the pressure at this location in the fluid loop.

Next, at the outlet from the first heat exchanger 14 positioned downstream of this first condenser 12, the fluid passes back into a diphasic state in which it is partially in the vapor phase (point 3 in FIG. 3) and its P(3), T(3) pair is thus located on the phase-change straight line.

Again, head losses reduce the vapor pressure as it passes through the conduit, up to the inlet point into the second condenser 17 (point 201 in FIG. 3).

In this second condenser 17, the vapor is entirely condensed and the outlet point from the second condenser (point 4 in FIG. 3) is again in the liquid domain of the diagram.

At the outlet from the second exchanger 19 located downstream of this second condenser 17, the fluid passes partially back into the vapor phase (point 5 in FIG. 3) and its P(5), T(5) pair is thus again located on the phase-change straight line.

Again, head losses reduce the vapor pressure as it passes through the conduit, up to the inlet point into the last condenser 22 (point 301 in FIG. 3).

In this last condenser 22, the vapor is condensed and the outlet point from the second condenser (point 6 in FIG. 3) is again in the liquid domain of the diagram.

The cooling liquid then flows as far as the liquid reservoir 70 (point 7) in contact with the microporous mass 80, then flows through the microporous mass 80 by capillarity, being overheated with respect to the normal vaporization conditions up to the point 401 in FIG. 3, where it is vaporized (return to point 1).

It should be noted that this diagram is given here only by way of example. There is no obligation for complete condensation and/or vaporization at the outlet from each condenser/heat exchanger and it is quite possible for all of points 2, 4, 6, 201, 301 to be located on the saturation curve. It is thus only the vapor content (proportion of vapor/proportion of liquid) which changes on passing through each section.

Four particular applications of the device described will be considered below.

1) Optical Instrument

In a first application, a device in accordance with the invention may be used to cool an optical instrument consisting of a set of detectors that typically dissipate several tens of Watts and also of remote electronics that typically dissipate several hundreds of Watts.

The evaporator 10 of the device is positioned in contact with the remote electronics. One and the same radiator located in the vicinity of the electronics and the detectors may serve as a single heat sink. The heat exchanger 14 is formed by a tube of small diameter that collects the heat produced by the detectors (corresponding to the secondary heat sources 15, 20).

In this application, the remote electronics may be located typically from several tens of centimeters to one or two meters away.

2) Instrument that Operates at Low Temperature

In a second application of the device, illustrated in FIG. 4, the item of equipment 15 to be cooled operates at an extremely low temperature (typically less than 100 K), whereas other elements (for example structural elements heated by the environment of the satellite) that may be formed by primary heat sources 41 are located away from the coldest part of the instrument and are at a temperature typically 20 K above the temperature of the item of equipment 15 to be cooled. The evaporator 10 of the device may be positioned on one of these elements 41. As a result, it is possible to make the fluid flow in the vapor phase in a relatively hot environment, thereby limiting heat exchanges between the environment and the fluid, and to condense in the immediate vicinity of (for example several centimeters away from) the item of equipment 15.

When use is made of fluids such as liquid oxygen, which are generally close to their triple point (solid, liquid and vapor state), it is possible, by way of a device as described, to cool in two stages that are favorable from a thermal point of view.

The evaporator 10 of the device is positioned, as in the previous example, in contact with a remote primary heat source 41.

The vapor generated in the evaporator 10 is evacuated toward a first condenser 12 located in the vicinity of the item of equipment 15.

The flow of the fluid in the vapor phase makes it possible to advantageously limit heat exchanges with the hot environment of the satellite. On the other hand, the flow of the vapor in the conduit 11 located between the evaporator 10 and the first condenser 12 generates a pressure drop (head loss) by virtue of the parietal friction of the fluid, which is all the greater the longer the conduit 11 is. This head loss is advantageous in our case by lowering the saturation temperature in the region of the condenser 12 (the dP/dT gradient of the saturation curve of the fluid being very low in the vicinity of the triple point) by several degrees. The (partial or complete) vaporization in the region of the heat exchanger 14 will thus take place at a lower temperature (by several degrees) than that taking place in the evaporator 10. In a variant embodiment, it may be advantageous to position a pressure reducer, such as those known from the prior art, in the vapor conduit 11 in order to accentuate the phenomenon. In another variant, with the same aim of accentuating the head loss, the length of the vapor conduit 11 is significantly increased compared with the minimum length that it may have, for example by way of serpentines or windings of the conduit.

The first condenser 12 may be realized by a radiator, a Stirling cycle machine or both at once, located in the vicinity of the item of equipment to be cooled 15.

The fluid thus partially or completely condensed by this first condenser 12 flows in a tube as far as a heat exchanger 14 located in the region of the item of equipment 15 to be cooled. The heat exchanger 14 may be a tube of small diameter.

The flow of the fluid in a tube which may be flexible makes it possible to have a possibly flexible thermal link between the first condenser 12 and the item of equipment 15, this being favorable to the non-transmission to the item of equipment 15 of vibrations that may be generated by the thermodynamic machine that generates the heat sink.

This heat exchanger 14, given the pressure drops and the low gradient (dP/dT) of the saturation curve (typically <1000 Pa/K), allows the vaporization of the fluid (and thus the absorption of energy by latent heat) at a temperature much lower than the saturation temperature of the evaporator 10.

The vapor thus formed then flows through a conduit toward a second condenser 22 located upstream of the evaporator 10. This heat exchanger 22 makes it possible to transform the vapor created by the heat exchanger 14 into liquid before it flows again through the evaporator 10, where all or part of this liquid will evaporate. The cooling of the second condenser 22 can be carried out by way of a radiator or a dedicated Stirling cycle machine.

This second condenser 22 may advantageously be located as close as possible to the evaporator 10. Thus, only vapor flows between the evaporator 10 and the item of equipment 15, this vapor then being weakly heated by the environment of the satellite.

3) Electronic Board

In a third application, illustrated in FIG. 5, the device is used in the case of an electronic board 40 containing a plurality of very dissipative components 15, 20, 41 that are separated from one another by a few millimeters to several centimeters. The low conductivity of the printed circuit board (PCB) makes it hard to transfer the heat generated by these components to a heat sink 42, which may be the soleplate of the electronic board 40, that is to say the mechanical interface between the board 40 and the electronic casing 43 in which it is located, or else the electronic casing 43 itself.

A device in accordance with the invention may advantageously be used to transfer the heat produced by the components 15, 20, 41 of the board 40 in the electronic casing 43 to the heat sink. The device may be a fluid micro-loop known to a person skilled in the art. This micro-loop is formed by a tube of constant diameter (typically a few millimeters).

The evaporator 10 of the fluid loop is brought into thermal contact with the most dissipative component 41 of the board (for example the microprocessor). Downstream of the evaporator 10, the tube is directed toward the heat sink 42, in contact with which the diphasic fluid of the device is cooled. The tube is then directed toward another component 15 to be cooled, and is brought into thermal contact with this component 15. It is then redirected toward the heat sink 42, before going to cool another component 20, etc.

4) Radiating Equipment Panel

As shown in FIG. 6, the device according to the invention may be designed for cooling a set of items of equipment 15, 20, 41 positioned on one of the faces 51 of an equipment panel 50, the other face 52 of the panel being in heat exchange with a heat sink which may be the cold space surrounding the system. The panel may be for example a sandwich panel having aluminum skins 51, 52 and an internal aluminum honeycomb structure 53. An evaporator 10 is advantageously positioned in heat exchange with the most dissipative equipment 41 which forms the primary heat source.

The thermal loop according to the invention is realized in this case by a simple tube, the different parts of which alternately form condensers and exchangers. As the sectional view in FIG. 6 shows, the tube may be integrated inside the panel (in the case of a sandwich panel) and for example be adhesively bonded to the skin of the panel on which the items of equipment 15, 20, 41 are positioned.

The fluid in the vapor phase 91 leaves the evaporator 10 in a first part 11, 12, 13 of the tube which is not in heat exchange with any item of equipment. In that part, the tube is in heat exchange with the outer skin 53 of the panel, by conduction through the internal structure 53 of the panel and by radiation. The part 11, 12, 13 of the tube thus forms a condenser within which the fluid is cooled.

If the path of the fluid is followed, it then flows through a part 14 located under the item of equipment 15 which thus forms a first secondary heat source. The fluid is heated and evaporates in this part, which thus forms a heat exchanger 14.

Without describing the rest of the path of the fluid in detail, it will be seen that the fluid flows through parts of the tube which alternately form condensers and evaporators, as far as the final part 21, 22, 23 that forms the last condenser 22, before returning to the evaporator 10.

It will be noted that in this particular application case of the device in accordance with the invention, the heat exchangers 14, 19 are also in heat exchange with the heat sink. However, they must be considered to be heat exchangers and not condensers when the items of equipment 15 and 20 are in operation, since their function is clearly to collect the heat emitted by these items of equipment. By contrast, when one of the items of equipment 15 or 20 is stopped and no longer dissipates, the corresponding heat exchanger 14 or 19 becomes a condenser since it is only in heat exchange with the heat sink.

This is an example of a thermal loop where a heat exchanger may become a condenser, and vice versa, depending on the state of the heat sources which it is necessary to cool.

ADVANTAGES

The present invention relates to a capillary-pumped fluid loop which is characterized by the presence of a capillary (porous, lattice) structure, the size of the pores of which is at least one order of magnitude smaller (10 times smaller) than the size of the tube, in order to create a capillary forward pressure sufficient to operate counter to gravity (with the hot source located at least 0.1 m above the cold source) and/or to support power densities greater than 10 W/cm$^2$. This contrasts with devices that use oscillating heat pipes which have a limited pumping capacity.

The present invention relates to the combination of the capillary flow rate which is created by one or more capillary evaporators with one or more heat exchangers which, in contrast in particular with the device as described in the patent document WO2011/007604, have the characteristic of being able to carry out heat exchanges (absorb energy) with one or more hot sources without the fluid which flows in the heat exchanger being entirely liquid.

Specifically, in order for a capillary evaporator to operate, it must be supplied with liquid, otherwise it will stop since the vapor is blocked by the porous material. This characteristic allows the system to be robust in transitional operation and in low-power operation and/or for the heat exchangers to be undersized.

In the device as described in the patent document WO2011/007604, each capillary heat exchanger is sized to evacuate all of the power transmitted to the evaporator preceding it (located upstream thereof in the direction of flow of the fluid loop).

In contrast, in the present invention, each condenser (heat exchanger) and the heat source (evaporator) located downstream thereof in the direction of flow, are sized (for example in terms of temperature of the heat source and the length of the tube in the region of the condenser) such that the flow rate of liquid leaving the condenser is sufficient for its vaporization in the heat exchanger which follows it to allow a large part of the heat dissipated by the heat source to be transferred to the fluid.

Finally, the present invention combines:—the forward pumping pressure of a capillary evaporator, located on a hot source and requiring a minimum power density to operate, with—the capacity to collect the heat on one or more heat sources which may be extended (large panel, focal plane, a plurality of items of equipment, etc.) by virtue of the heat exchanger(s) which can operate regardless of the power density.

Such a device thus has the advantage of cooling a plurality of heat sources by using only a single capillary evaporator. A flow of fluid is produced in a passive manner by virtue of the capillary evaporator positioned on the primary heat source. This flow may be greater or lesser depending on the thermal power applied to the evaporator.

The present invention makes it possible to use a large-size evaporator, in order to deliver a high flow rate of fluid and a high pumping pressure.

In addition, the present invention makes it possible to voluntarily multiply areas of heat exchange (which may be formed by micro heat exchangers such as a very small-size tube). A plurality of secondary heat sources may optionally be cooled between two condensation points (depending on the thermal power dissipated by each one). As long as liquid remains in the heat exchangers, it will be possible to absorb the thermal energy dissipated by a secondary heat source by phase change.

VARIANTS

In a variant of the device, a heater 39 may be positioned in thermal contact with the evaporator 10 of the device and be used in a transitional or continuous manner in order to supply additional thermal power to the evaporator and thus increase the flow rate of fluid leaving the evaporator, for example in order to increase the thermal transfers carried out by the device.

In another variant of the device, which is shown in FIG. 7, the last condenser 22 is integrated in the evaporator 10. It is for example a face 22 of the evaporator in heat exchange with a heat sink 60, it being possible for the latter to be created locally by a thermodynamic machine. It is advantageous for this cold face of the evaporator to face away from the face of the evaporator that is in heat exchange with the primary heat source 41.

The invention claimed is:

1. A cooling device for cooling at least two separate heat sources, further comprising:
    a closed circuit in which a diphasic fluid flows;
    a single capillary evaporator configured to produce a pumping pressure and in thermal contact with a primary heat source which is one of the heat sources;
    a heat exchanger in thermal contact with a secondary heat source to be cooled and not producing any pumping pressure;
    at least one first condenser positioned downstream of the capillary evaporator and upstream of the heat exchanger;
    at least one last condenser positioned upstream of the capillary evaporator and downstream of the heat exchanger;
    wherein the heat exchanger and the condensers are dimensioned such that head losses in the circuit are less than a maximum capillary pressure of the capillary evaporator; and wherein a pressure of the diphasic fluid in the closed circuit continuously decreases from a capillary evaporator exit during an operation of the cooling device.

2. The device as claimed in claim 1, further comprising at least one secondary condenser positioned between two secondary heat sources.

3. The device as claimed in claim 1, wherein condensers positioned upstream and downstream of the heat exchanger are configured to be positioned in thermal contact with heat sinks.

4. The device as claimed in claim 1, wherein the heat exchanger is formed by a tube having a diameter in a millimeter range.

5. The device as claimed in claim 1, wherein the closed circuit is produced in a form of a tube having a capillary internal structure at least in a region of the heat exchanger.

6. The device as claimed in claim 1, wherein the last condenser is integrated in a reservoir of the capillary evaporator.

7. A thermal loop comprising at least two heat sources, at least one heat sink, and a cooling device as claimed in claim 1.

8. The thermal loop as claimed in claim 7, wherein the capillary evaporator is positioned on a most dissipative heat source, which is the primary heat source.

9. The thermal loop as claimed in claim 7, wherein the primary heat source has a thermal power greater than or equal to a sum of the thermal powers of the secondary heat sources that are located between any pair of successive condensers.

10. The thermal loop as claimed in claim 7, further comprising a heater configured to be positioned in a region of the primary heat source to create a thermal power which is added to a thermal power of the primary heat source such that a sum of powers dissipated by the primary heat source and the heater is greater than or equal to a sum of the thermal powers of the secondary heat sources that are located between any pair of successive condensers.

11. The thermal loop as claimed in claim 7, wherein at least two condensers are positioned on one and same heat sink.

12. The thermal loop as claimed in claim 7, wherein the head loss between the capillary evaporator, or a heat exchanger, on one side, and a condenser located downstream of the capillary evaporator, or of the heat exchanger, on the other side, is configured to lower vaporization temperature in the heat exchanger located downstream of the condenser below a given value.

13. The thermal loop as claimed in claim 12, wherein the head loss is brought about by a device that lowers a pressure in a fluid conduit located between the capillary evaporator, or the heat exchanger, on one side, and the condenser on the other side.

14. The thermal loop as claimed in claim 12, wherein the head loss is brought about by adapting at least one of length or a diameter of a fluid conduit located between the evaporator, or the heat exchanger, on one side, and the condenser on the other side.

15. The cooling device as claimed in claim 1 is configured to cool an instrument.

16. The thermal loop as claimed in claim 7 is configured to cool an instrument.

17. The cooling device as claimed in claim 1 is formed on an electronic board.

18. The cooling device as claimed in claim 17, wherein a heat sink is formed by a soleplate of the electronic board.

19. The thermal loop as claimed in claim 7 is formed on an electronic board.

20. The thermal loop as claimed in claim 19, wherein the heat sink is formed by a soleplate of said electronic board.

21. The cooling device as claimed in claim 1 is positioned in an equipment panel.

22. The cooling device as claimed in claim 21, wherein the equipment panel further comprises a first face on which items of an equipment are fastened and a second face opposite the first face is a heat sink.

23. The cooling device as claimed in claim 21, further comprising an evaporator and a conduit comprising successively different parts: condensers and heat exchangers, the parts of the conduit that are connected to the evaporator being condensers.

24. The thermal loop as claimed in claim 7 is positioned in an equipment panel.

25. The thermal loop as claimed in claim 24, wherein the equipment panel further comprises a first face on which items of an equipment are fastened and a second face opposite the first face is a heat sink.

26. The thermal loop as claimed in claim 24, further comprising an evaporator and a conduit comprising successively different parts: condensers and heat exchangers, the parts of the conduit that are connected to the evaporator being condensers.

27. The cooling device as claimed in claim 1 for use in a satellite.

28. The thermal loop as claimed in claim 7 for use in a satellite.

* * * * *